United States Patent
Yong et al.

(10) Patent No.: US 10,484,231 B2
(45) Date of Patent: Nov. 19, 2019

(54) ROUTING-OVER-VOID-T-LINE-COMPENSATION

(71) Applicant: Intel Corporation, Santa Clara, CA (US)

(72) Inventors: Khang Choong Yong, Puchong (MY); Bok Eng Cheah, Bukit Gambir (MY); Jackson Chung Peng Kong, Tanjung Tokong (MY); Stephen Harvey Hall, Forest Grove, OR (US); Yun Rou Lim, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/021,292

(22) Filed: Jun. 28, 2018

(65) Prior Publication Data

US 2019/0007259 A1 Jan. 3, 2019

(30) Foreign Application Priority Data

Jun. 30, 2017 (MY) ................................ 2017702410

(51) Int. Cl.
*H04L 29/10* (2006.01)
*H05K 1/02* (2006.01)
*H01R 13/66* (2006.01)

(52) U.S. Cl.
CPC ......... *H04L 29/10* (2013.01); *H01R 13/6658* (2013.01); *H01R 13/6691* (2013.01); *H05K 1/025* (2013.01); *H05K 1/0251* (2013.01); *H05K 2201/09345* (2013.01); *H05K 2201/09727* (2013.01)

(58) Field of Classification Search
None
See application file for complete search history.

(56) References Cited

U.S. PATENT DOCUMENTS

| 7,182,649 B2* | 2/2007 | Caveney | H05K 1/0228 439/620.22 |
| 7,726,018 B2* | 6/2010 | Caveney | H05K 1/0228 29/872 |
| 2010/0223786 A1* | 9/2010 | Caveney | H05K 1/0228 29/876 |
| 2011/0287642 A1* | 11/2011 | Wang | H01R 9/031 439/83 |
| 2019/0008029 A1* | 1/2019 | Yong | H01L 23/645 370/463 |

* cited by examiner

*Primary Examiner* — Anh Vu H Ly
(74) *Attorney, Agent, or Firm* — Schwegman Lundberg & Woessner, P.A.

(57) ABSTRACT

Apparatus and methods are provided for ameliorating distortion issues associated with a conductor that passes over a void in a reference plane. In an example, the signal conductor can include a first part routed over the major surface of a first side of the reference plane structure on a first side of the void and that approaches a first edge of the reference plane structure with a first trajectory, a second part routed over the major surface of the reference plane structure on a second side of the void and that approaches a second edge of the reference plane structure with a second trajectory, and a third portion connecting the first portion with the second portion, the third portion spanning the void, and having a plurality of spurs extending from a body of the third portion.

20 Claims, 6 Drawing Sheets

ROUTING-OVER-VOID-T-LINE-COMPENSATION

This application claims the benefit of priority to Malaysian Application Serial No. PI 2017702410, filed Jun. 30, 2017, which is incorporated herein by reference in its entirety.

TECHNICAL FIELD

The disclosure herein relates generally integrated circuits and more particularly to compensating techniques for transmission lines that traverse gaps in an integrated circuit.

BACKGROUND

The continued evolution of integrated circuits have enabled shrinking ever more powerful computational and communication functionality into smaller and smaller devices. As the devices have become smaller and device frequencies higher, these desired characteristics have given rise to challenges that if not dealt with will limit the evolution process. For example, the push to reduce the size of a device can necessitate rearranging sub-devices. The rearrangement can introduce less than ideal conditions for some functionality, such as, routing transmission lines of the device over reference plane voids. Such arrangements can cause distortion of signals using the transmission line.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
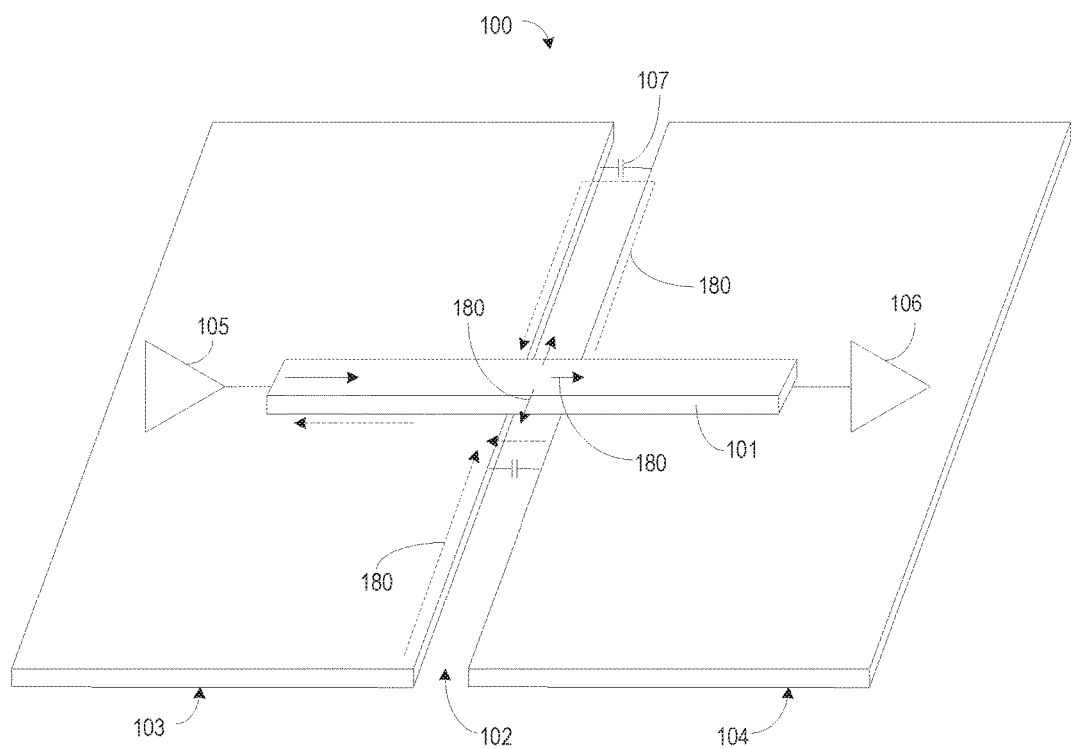
FIG. 1 illustrates generally a portion of a circuit or printed circuit board with a signal routing such as a signal conductor or a signal trace that traverses a void in a reference plane.

FIG. 1 illustrates generally an apparatus or portion of a circuit 100 or printed circuit board with a signal routing such as a signal conductor 101 or a signal trace that traverses a void 102 in a reference plane of a substrate, for example. FIG. 1 shows one or more reference planes 103, 104, a drive circuit 105, a receiver circuit 106, and a signal conductor 101 coupling the drive circuit 105 to the receiver circuit 106, where the signal conductor 101 is routed over the void 102. In general, routing a signal conductor 101 over a void 102 in one or more reference planes can result in a number of issues including, but not limited to, signal propagation delay due to higher return current inductance, signal rise/fall time distortion due to a signal propagation delay mismatch, and higher trace impedance due to reduced capacitance between the signal conductor and reference plane. These issues can be very prevalent for high speed busses, such as busses operating at 4 gigabits per second (Gbps) or higher. However, such issues can impact the performance of slower busses also such as those operating at 200 megahertz (MHz) or less. As the signal conducts along the signal conductor, current passes through the conductor and the one or more reference planes. As the signal encounters the void, the signal current can fragment and seek one or more alternative paths 180. Generally, the alternative paths 180 can introduce delays, and transitions of the signal can be significantly distorted by the time each transition reaches the receiver. These signal distortion issues are known, however, due to consumer demand and industry trends to miniaturize, having signals traversing reference plane voids has become common. Beyond adding additional layers to provide continuous reference planes, which is contradictory to shrinking circuit size, current solutions can include implementing stitching capacitors 107 across the void 102 which can add additional manufacturing processing and cost.

Figure 2A:
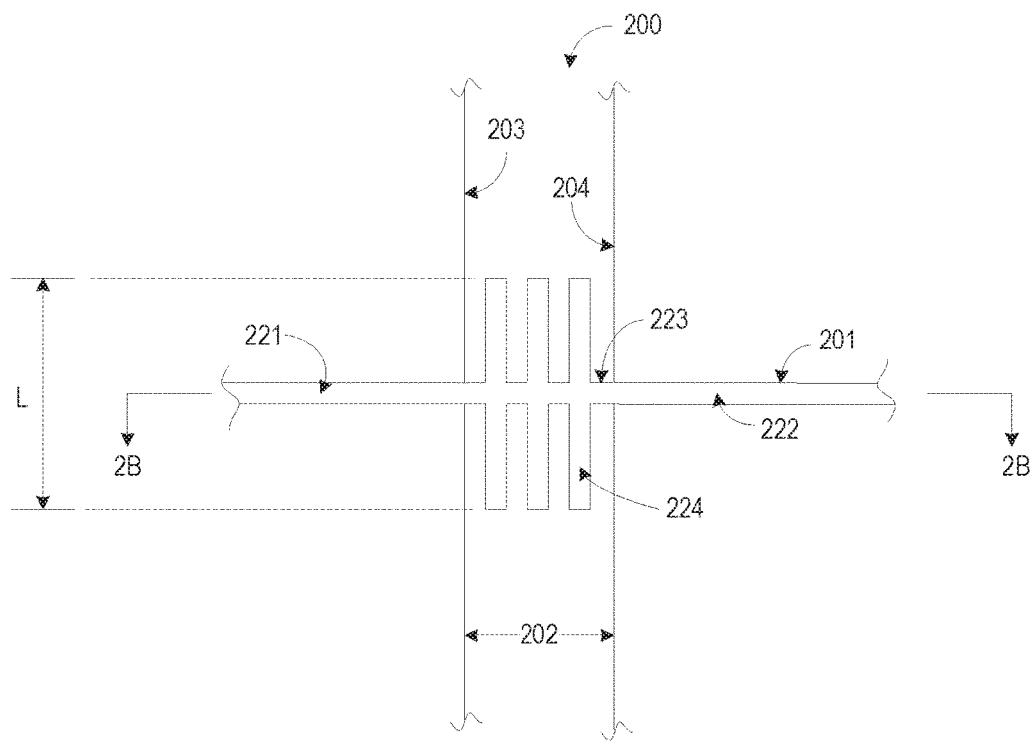
FIG. 2A illustrates generally an example signal conductor for spanning a void that can ameliorate distortion issues associated with a conductor passing straight over a void in a reference plane as illustrated in FIG. 1.
Figure 2B:
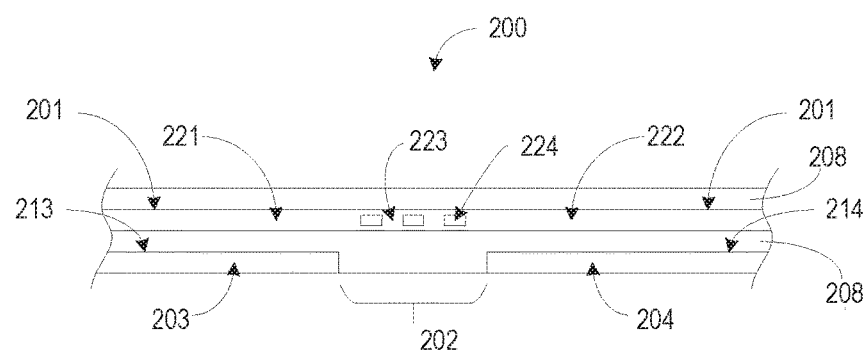
FIG. 2B illustrates generally a cross-section view of the example of FIG. 2A.

FIG. 2A illustrates generally an example signal conductor 201 for spanning a void 202 that can ameliorate distortion issues associated with a conductor passing straight over a void in a reference plane as illustrated in FIG. 1. FIG. 2B illustrates generally a cross-section view of the example of FIG. 2A. In certain examples, the portion 200 of the circuit that includes the void 202 can include a first reference plane 203 having a first major surface 213, a second reference plane 204 having a second major surface 214, a void 202 between the first reference plane 203 and the second reference plane 204, a signal conductor 201 over lying the major surfaces 213, 214 of the first reference plane 203 and the second reference plane 204 and spanning the void 202, and dielectric material 208. In certain examples, the dielectric material 208 can fill the void 202 between the first reference plane 203 and the second reference plane 204. In certain examples, the dielectric material 208 can separate the signal conductor 201 from the first major surface 213 of the first reference plane 203 and from the second major surface 214 of the second reference plane 204. In certain example, the dielectric material 208 can overlay and or encapsulate the signal conductor 201. In certain examples, the dielectric material 208 can include but not limited to epoxy resin, FR-4 glass-reinforced epoxy, bismaleimide-triazine resin, polyimide, or combinations thereof.

In certain examples, the signal conductor 201 can include a first portion 221 routed over the first major surface 213 and that approaches a first edge of the first reference plane structure 203 with a first trajectory. The signal conductor 201 can include a second portion 222 routed over the second major surface 214 of the second reference plane structure 204 and that approaches a second edge of the second reference plane structure 204 with a second trajectory. In certain examples, the first trajectory can align with the second trajectory. The signal conductor 201 can include a third portion 223 that connects the first portion 221 with the second portion 222 and spans the void 202. In certain examples, the third portion 223 can include a number of spurs 224 that extend from the body of the third portion 223. The body of the third portion 223 can be that part of the third portion 223 that connects the first portion 221 of the signal conductor 201 with the second portion 222 of the signal conductor 201. In certain examples, the spurs can extend from the body parallel with the major surfaces 213, 214 of the first and second reference plane structures 203, 204. In certain examples, each spur can have a corresponding spur extending from the body of the third portion in an opposite direction. In certain examples, the spurs generally extend from the body of the third portion at a right angle. In some examples, the spurs extend from the body of the third portion at an acute angle.

In certain examples, the spurs promote fragmentation of the signal current. In certain examples, the spurs fragmentation of the signal caused by the spurs or the extended signal path length provided by the third portion 223 of the signal conductor 201 can operate to equalize signal delay of the signal conductor 201 with portions of the signal affected by the impedance and capacitive anomalies associated with the reference plane void 202. In certain examples, the width or cross-section area of the body of the third portion 223 of the signal conductor 201 is the same as or greater than the width or cross-section area of the first portion 221 of the signal conductor 201 and is the same as or greater than the width or cross-section area of the second portion 222 of the signal conductor 201. In certain examples, the width or cross-section area of the spurs of the third portion 223 of the signal conductor 201 is the same as or greater than the width or cross-section area of the first portion 221 of the signal conductor 201 and is the same as or greater than the width or cross-section area of the second portion 222 of the signal conductor 201. In certain examples, the length (L) of the spurs 224 from the tip of one spur to a corresponding opposing spur can be configurable in accordance with the timing delay mismatch magnitude of the signal conductor 201. As a nonexclusive example, for a void 202 of about 50-100 mils, the length of the spurs 224 can be in the range of 5 mils to 20 mils to match the non-ideal current return path of the signal. It is understood that the spurs 224 can include cross-sectional shapes that differ than the shape shown in FIG. 2B without departing from the scope of the present subject matter.

Figure 3:
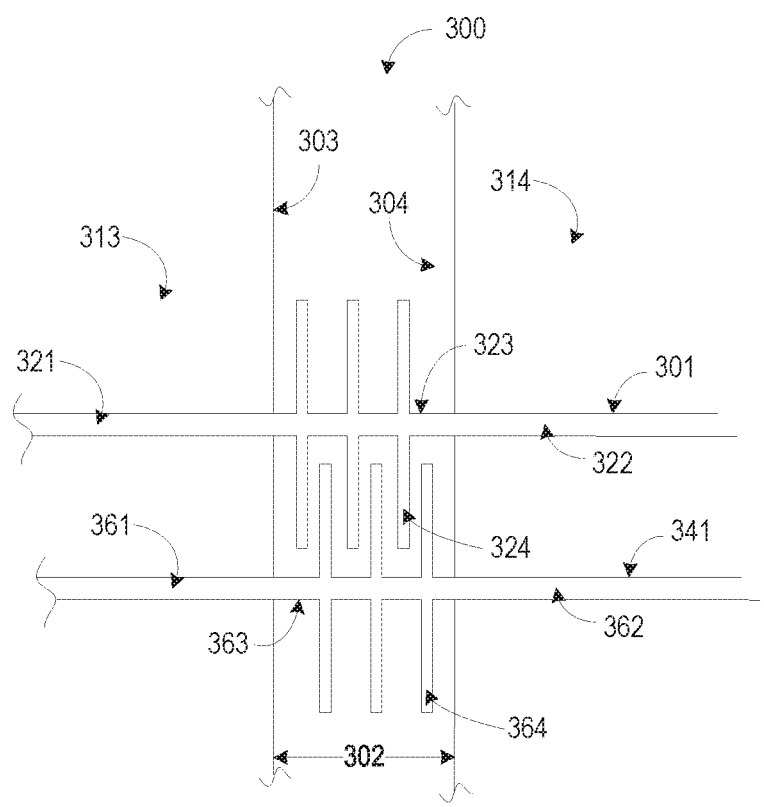
FIG. 3 illustrates generally a circuit portion that includes multiple example conductor traversing a void between reference plane sections.

FIG. 3 illustrates generally a circuit portion 300 that includes multiple example conductor 301, 341 traversing a void 302 between reference plane sections 303, 304. In certain examples, the portion 300 of the circuit that includes the void 302 can include a first reference plane section 303 having a first major surface, a second reference plane section 304 having a second major surface, a void 302 between the first reference plane section 303 and the second reference plane section 304, first and second signal conductors 301, 341 over lying the major surfaces of the first reference plane section 303 and the second reference plane section 304, and spanning the void 302, and dielectric material (not shown). In certain examples, the dielectric material can fill spaces between the first reference plane section 303 and the second reference plane section 304. In certain examples, the dielectric material can separate the signal conductors 301, 341 from the first reference plane section 303 and from the second reference plane section 304. In certain example, the dielectric material can overlay and or encapsulate the signal conductors 301, 341.

In certain examples, the each signal conductor 301, 341 can include a first portion 321, 361 routed over the first major surface of the first reference plane structure 303 and that approaches a first edge of the first reference plane structure 303, at the void 302, with a first trajectory. Each signal conductor 301, 341 can include a second portion 322, 362 routed over the second major surface of the second reference plane structure 304 and that approaches a second edge of the second reference plane structure 304, at the void 302, with a second trajectory. In certain examples, the first trajectory can align with the second trajectory. Each signal conductor 301, 341 can include a third portion 323, 363 that connects the respective first portion 321, 361 with the respective second portion 322, 362 and spans the void 302.

In certain examples, the third portion 323, 363 of each signal conductor 301. 341 can include a number of spurs 324, 364 that extend from the body of the third portion 323, 363. The body of the third portion 323, 363 can be that part of the third portion 323, 363 that connects the first portion 321, 361 of the respective signal conductor 301, 341 with the second portion 322, 362 of the signal conductor 301, 341. In certain examples, the spurs 324, 364 can extend from the body parallel with the major surfaces 313, 314 of the first and second reference plane structures 303, 304. In certain examples, each spur 324, 364 can have a corresponding spur extending from the body of the third portion 323 in an opposite direction. In certain examples, the spurs 324, 364 generally extend from the body of the third portion 323, 364 at a right angle. In some examples, the spurs 324, 364 extend from the body of the third portion 323, 363 at an acute angle. In certain examples, the spurs 324 from the first signal conductor 301 can interleave with the spurs 364 from the second signal conductor 341 to allow for efficient spacing of the signal conductors 301, 341.

In each of the figures discussed above, the signal conductors approach the respective edge of the void at 90 degrees. It is understood that approaching the edge of the void, for any of the conductors, at an angle other than 90 degrees is possible and does not depart from the scope of the present subject matter. In each of the figures discussed above, the void appears to be void separating two distinct reference plane structures. In certain examples, such distinct reference plane structures can be at different reference potentials. In certain example, the first reference plane structure 303 can be associated with a ground (Vss) reference voltage and the second reference plane structure 304 can be associated with a power (Vcc) reference voltage. It is understood that, in certain examples, the void can be an opening or a slot in a single reference plane structure without departing from the scope of the present subject matter.

Figure 4:
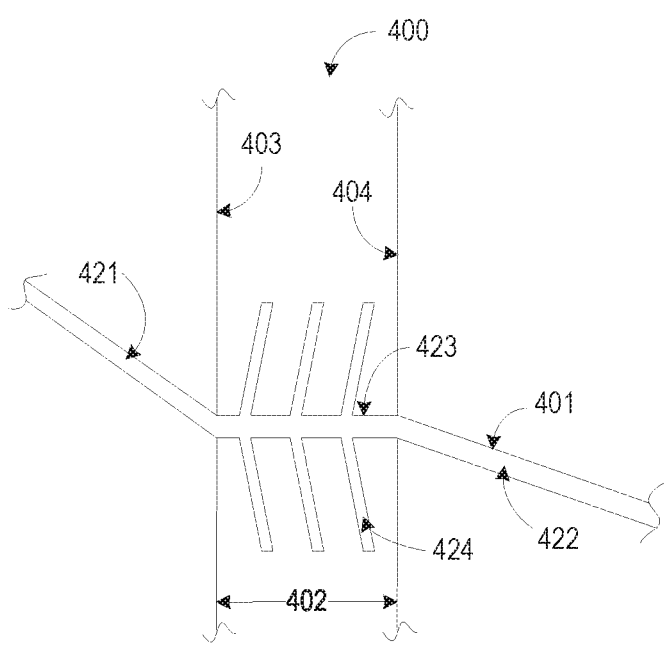
FIG. 4 illustrates generally an example system for traversing a void in a reference plane structure with a signal conductor.

FIG. 4 illustrates generally an example system 400 for traversing a void in a reference plane structure with a signal conductor. FIG. 4 illustrates generally an example signal conductor 401 for spanning a void 402 that can ameliorate distortion issues associated with a conductor passing straight over a void in a reference plane as illustrated in FIG. 1. In certain examples, the portion 400 of the circuit that includes the void 402 can include a first reference plane 403 having a first major surface, a second reference plane 404 having a second major surface, a void 402 between the first reference plane 403 and the second reference plane 404, a signal conductor 401 over lying the major surfaces of the first reference plane 403 and the second reference plane 404 and spanning the void 402, and dielectric material (not shown). In certain examples, the dielectric material can fill the void 402 between the first reference plane 403 and the second reference plane 404. In certain examples, the dielectric material can separate the signal conductor 401 from the first major surface of the first reference plane 403 and from the second major surface of the second reference plane 404. In certain example, the dielectric material can overlay and or encapsulate the signal conductor 401.

In certain examples, the signal conductor 401 can include a first part 421 routed over the first major surface and that approaches a first edge of the first reference plane structure 403 with a first trajectory. The signal conductor 401 can include a second portion 422 routed over the second major surface of the second reference plane structure 404 and that approaches a second edge of the second reference plane structure 404 with a second trajectory. In certain examples, the first trajectory can be parallel with the second trajectory. In some examples, the first trajectory is not parallel with the second trajectory. The signal conductor 401 can include a third portion 423 that connects the first portion 421 with the second portion 422 and spans the void 402. In certain examples, the third portion 423 can include a number of spurs 424 that extend from the body of the third portion 423. The body of the third portion 423 can be that part of the third portion 423 that connects the first portion 421 of the signal conductor 401 with the second portion 422 of the signal conductor 401. In certain examples, the spurs 424 can extend from the body parallel with the major surfaces of the first and second reference plane structures. In certain examples, each spur 424 can have a corresponding spur extending from an opposite side of the body of the third portion 423. In some examples, the spurs 424 can extend from the body of the third portion 423 at an acute angle.

Figure 5A:
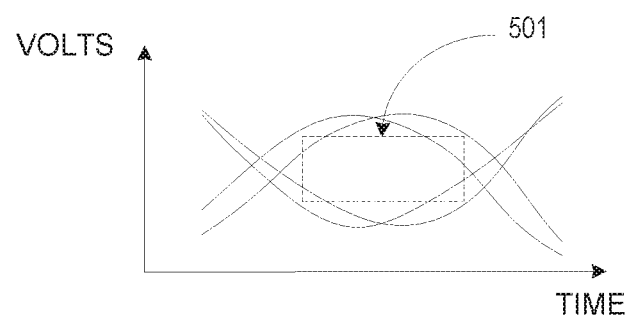
FIGS. 5A and 5B illustrate comparatively an example improvement in signal quality at the receiver circuit that can be achieved using a circuit structure as discussed above with reference to FIGS. 2A-4.
Figure 5B:
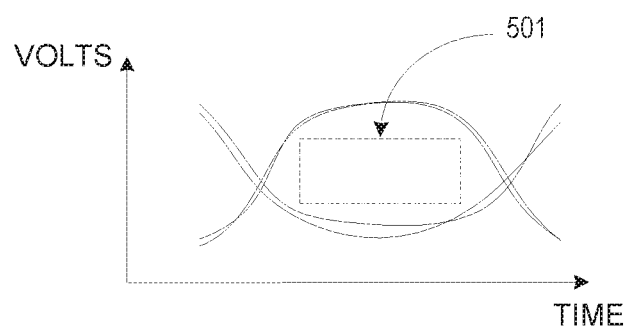

FIGS. 5A and 5B illustrate comparatively an example improvement in signal quality at the receiver circuit than can be achieved using a circuit structure as discussed above with reference to FIGS. 2A-4. FIG. 5A illustrates variation of signal voltages with respect to time of a square wave received at the receiver circuit using a conductor that spans a void in a reference plane structure as shown in FIG. 1. FIG. 5B illustrates generally example variation of signal patterns with respect to time of a square wave received at the receiver circuit using a conductor that spans a void in a reference plane structure as shown in any of FIGS. 2A-4.

Aggregating signal variation at the receiver can allow for definition of a signal eye 501 that represents the operating capabilities generally necessary in the receiver circuit to robustly detect the signal. In general, the bigger the eye 501, the more relaxed the specifications for the receiver can be to robustly detect and process information received on the signal conductor. In addition, a more relaxed receiver specification can result in less complex or less costly receivers. For a given specification (e.g., at an operating frequency) that requires the illustrated eye 501, FIG. 5A illustrates that the specification may not be possible because the signal extremes plotted in FIG. 5A do not steer clear of the signal eye 501 defined by the given specification. A factor that can contribute to the signal not steering clear of the signal eye 501 (e.g., timing and voltage margins) can be the various conduction delays associated with the signal routing of FIG. 1. Conversely, FIG. 5B illustrates that routing the signal as discussed above with respect to FIGS. 2A-4 can allow for more robust receiver performance of the signal or for reception of higher frequency signals because the signal extremes plotted in FIG. 5B steer clear of the signal eye 501 defined by the given specification. In certain examples, using a routing as shown in FIGS. 2A-4 can assist in equalizing the extremes of the conduction delays associated with routing the signal over a void in one or more reference planes.

Figure 6:
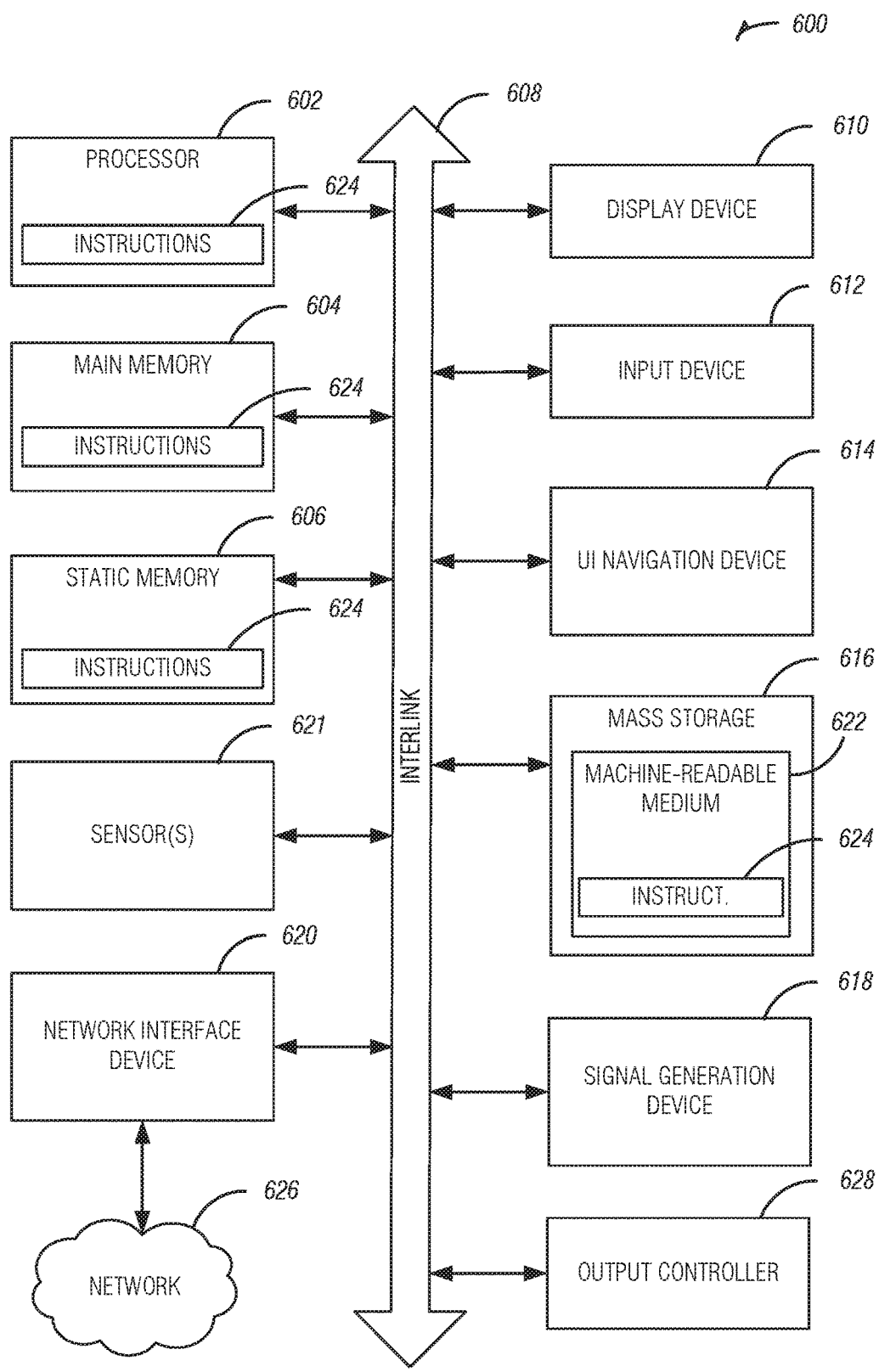
FIG. 6 illustrates a block diagram of an example machine upon which any one or more of the techniques (e.g., methodologies) discussed herein may perform.

FIG. 6 illustrates a block diagram of an example machine 600 upon which any one or more of the techniques (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (or other distributed) network environment. As used herein, peer-to-peer refers to a data link directly between two devices (e.g., it is not a hub- and spoke topology). Accordingly, peer-to-peer networking is networking to a set of machines using peer-to-peer data links. The machine 600 may be a single-board computer, an integrated circuit package, a system-on-a-chip (SOC), a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 600 may include a hardware processor 602 (e.g., a central processing unit (CPU), a graphics processing unit (GPU), a hardware processor core, or any combination thereof), a main memory 604 and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example, the display unit 610, input device 612 and UI navigation device 614 may be a touch screen display. The machine 600 may additionally include a storage device (e.g., drive unit) 616, a signal generation device 618 (e.g., a speaker), a network interface device 620, and one or more sensors 621, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 616 may include a machine readable medium 622 on which is stored one or more sets of data structures or instructions 624 (e.g., software) embodying or utilized by any one or more of the techniques or functions described herein.

The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 616 may constitute machine readable media.

While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer networks, among others. In an example, the network interface device 620 may include one or more physical jacks (e.g., Ethernet, coaxial; or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

ADDITIONAL EXAMPLES AND NOTES

In Example 1, an apparatus can include a reference plane structure, a void between two edges of the reference plane structure, and a first signal conductor routed over a major surface of the reference plane structure and spanning the void. The first signal conductor can include a first portion routed over the major surface of a first side of the void and that approaches a first edge of the reference plane structure with a first trajectory, a second portion routed over the major surface of a second side of the void and that approaches a second edge of the reference plane structure with a second trajectory in-line with the first trajectory, and a third portion connecting the first portion with the second portion and having a plurality of spurs extending from a body of the third portion.

In Example 2, a length of the third portion in the direction of signal flow via the first signal conductor of Example 1 optionally is consummate with a distance across the void between the first edge and the second edge, the distance across the void measured at first edge where the first part approaches the first edge and at the second edge where the second part approaches the second edge.

In Example 3, a first spur of the plurality of spurs of any one or more of Examples 1-2 optionally extends from the body of the third portion.

In Example 4, a second spur of the plurality of spurs of any one or more of Examples 1-3 optionally extends from the body of the third portion opposite the first spur to form a first spur pair.

In Example 5, each of the first spur and the second spur of any one or more of Examples 1-4 optionally extend from the body of the third portion at an acute angle.

In Example 6, the acute angle associated with the first spur of any one or more of Examples 1-5 optionally is equal to the acute angle associated with the second spur.

In Example 7, the first spur pair of any one or more of Examples 1-6 optionally is one of a plurality of spur pairs and wherein the plurality of spur pairs include the plurality of spurs.

In Example 8, each spur pair of the plurality of spur pairs of any one or more of Examples 1-7 optionally is equidistant from each immediately adjacent spur pair.

In Example 9, a first spur of the plurality of spurs of any one or more of Examples 1-8 optionally extends perpendicular from the body of the third portion.

In Example 10, a second spur of the plurality of spurs of any one or more of Examples 1-9 optionally extends perpendicular from the body of the third portion.

In Example 11, a second spur of the plurality of spurs of any one or more of Examples 1-10 optionally extends perpendicular from the body of the third portion opposite the first spur.

In Example 12, the reference plane of any one or more of Examples 1-11 optionally is a singular structure and the void is part of an opening within the singular structure.

In Example 13, the apparatus of any one or more of Examples 1-12 optionally includes a dielectric configured to separate the first signal conductor from the reference plane structure.

In Example 14, the reference plane structure of any one or more of Examples 1-13 optionally includes a first reference plane including the first edge and configured to be at a first reference potential, and a second reference plane including the second edge and configured to be at a second reference potential different from the first reference potential.

In Example 15, the first trajectory of any one or more of Examples 1-14 optionally is perpendicular to the first edge and the second edge.

In Example 16, the apparatus of any one or more of Examples 1-15 optionally includes a second signal conductor routed over a major surface of the reference plane structure and spanning the void.

In Example 17, the second signal conductor of any one or more of Examples 1-15 optionally includes a first part routed over the major surface of a first side of the void and that approaches a first edge of the reference plane structure with a first trajectory, a second part routed over the major surface of a second side of the void and that approaches a second edge of the reference plane structure with a second trajectory in-line with the first trajectory, and a third portion connecting the first portion with the second portion and having a plurality of spurs extending from a body of the third portion.

In Example 18, one of the plurality of spurs of the third portion of the second signal conductor of any one or more of Examples 1-17 optionally is interleaved with one of the plurality of spurs of the third portion of the first signal conductor.

In Example 19, the plurality of spurs of the third portion of the second signal conductor of any one or more of Examples 1-18 optionally is interleaved with the plurality of spurs of the third portion of the first signal conductor.

In Example 20, a first spur of the plurality of spurs of the second signal conductor of any one or more of Examples 1-19 optionally extends from a body of the third portion of the second signal conductor, a second spur of the plurality of spurs of the second signal conductor of any one or more of Examples 1-19 optionally extends from the body of the third portion opposite the first spur of the second signal conductor to form a first spur pair of the second signal conductor, the first spur pair of the second signal conductor of any one or more of Examples 1-19 optionally is one of a second plurality of spur pairs and wherein the second plurality of spur pairs include the plurality of spurs of the second signal conductor, and each spur pair of the second plurality of spur pairs of any one or more of Examples 1-19 optionally is equidistant from each immediately adjacent spur pair of the second plurality of spur pairs.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are legally entitled.

What is claimed is:

1. An apparatus comprising:
    a reference plane structure;
    a void between two edges of the reference plane structure;
    a first signal conductor routed over a major surface of the reference plane structure and spanning the void;
    wherein the first signal conductor includes:
        a first portion routed over the major surface of a first side of the void and that approaches a first edge of the reference plane structure with a first trajectory;
        a second portion routed over the major surface of a second side of the void and that approaches a second edge of the reference plane structure with a second trajectory in-line with the first trajectory; and a third portion connecting the first portion with the second portion and having a plurality of spurs extending from a body of the third portion.

2. The apparatus of claim 1, wherein a length of the third portion in the general direction of signal flow via the first signal conductor is consummate with a distance across the void between the first edge and the second edge, the distance across the void measured at first edge where the first portion approaches the first edge and at the second edge where the second portion approaches the second edge.

3. The apparatus of claim 1, wherein a first spur of the plurality of spurs extends from the body of the third portion.

4. The apparatus of claim 3, wherein a second spur of the plurality of spurs extends from the body of the third portion opposite the first spur to form a first spur pair.

5. The apparatus of claim 4, wherein the first spur pair is one of a plurality of spur pairs and wherein the plurality of spur pairs include the plurality of spurs.

6. The apparatus of claim 1, wherein a first spur of the plurality of spurs extends perpendicular from the body of the third portion.

7. The apparatus of claim 1, wherein the reference plane is a singular structure and the void is part of an opening within the singular structure.

8. The apparatus of claim 1, including a dielectric configured to separate the first signal conductor from the reference plane structure.

9. The apparatus of claim 1, wherein the reference plane structure includes:
a first reference plane including the first edge and configured to be at a first reference potential; and
a second reference plane including the second edge and configured to be at a second reference potential different from the first reference potential.

10. The apparatus of claim 1, wherein the first trajectory is perpendicular to the first edge and the second edge.

11. The apparatus of claim 1, including a second signal conductor routed over a major surface of the reference plane structure and spanning the void.

12. The apparatus of claim 11, wherein the second signal conductor includes:
a first portion routed over the major surface of a first side of the void and that approaches a first edge of the reference plane structure with a first trajectory;
a second portion routed over the major surface of a second side of the void and that approaches a second edge of the reference plane structure with a second trajectory in-line with the first trajectory; and
a third portion connecting the first portion with the second portion and having a plurality of spurs extending from a body of the third portion.

13. The apparatus of claim 12, wherein one of the plurality of spurs of the third portion of the second signal conductor is interleaved with one of the plurality of spurs of the third portion of the first signal conductor.

14. The apparatus of claim 12, wherein the plurality of spurs of the third portion of the second signal conductor is interleaved with the plurality of spurs of the third portion of the first signal conductor.

15. The apparatus of claim 12, wherein a first spur of the plurality of spurs of the second signal conductor extends from a body of the third portion of the second signal conductor;
wherein a second spur of the plurality of spurs of the second signal conductor extends from the body of the third portion opposite the first spur of the second signal conductor to form a first spur pair of the second signal conductor;
wherein the first spur pair of the second signal conductor is one of a second plurality of spur pairs and wherein the second plurality of spur pairs include the plurality of spurs of the second signal conductor;
wherein each spur pair of the second plurality of spur pairs is equidistant from each immediately adjacent spur pair of the second plurality of spur pairs.

16. A system comprising:
a substrate including a reference plane structure;
a first integrated circuit chip mounted to the substrate;
a second integrated circuit chip; and
a signal conductor mounted to the substrate, the signal conductor configured to couple between the first chip and the second chip and to span a void in the reference plane structure, the signal conductor comprising:
a first portion routed over a major surface of a first side of the void and that approaches a first edge of the reference plane structure with a first trajectory;
a second portion routed over a major surface of a second side of the void and that approaches a second edge of the reference plane structure with a second trajectory; and
a third portion connecting the first portion with the second portion and having a plurality of spurs extending from a body of the third portion.

17. The system of claim 16, wherein the substrate is a printed circuit board.

18. The system of claim 16, wherein the substrate is one of a plurality of substrates of an integrated circuit package.

19. The system of claim 18, wherein the first integrated circuit is a processor; and
wherein the second integrated circuit is wireless communication controller.

20. The system of claim 19, including an operator interface configured to control functions provided by the processor and the wireless controller and to display status indications of the processor and the wireless communication controller.

* * * * *